(12) United States Patent
Toumiya

(10) Patent No.: US 8,300,128 B2
(45) Date of Patent: Oct. 30, 2012

(54) SOLID-STATE IMAGE PICKUP DEVICE AND ELECTRONIC APPARATUS

(75) Inventor: Yoshinori Toumiya, Kanagawa (JP)

(73) Assignee: Sony Corporation, Tokyo (JP)

( * ) Notice: Subject to any disclaimer, the term of this patent is extended or adjusted under 35 U.S.C. 154(b) by 324 days.

(21) Appl. No.: 12/435,502

(22) Filed: May 5, 2009

(65) Prior Publication Data

US 2009/0278967 A1    Nov. 12, 2009

(30) Foreign Application Priority Data

May 9, 2008    (JP) ................................ 2008-123942

(51) Int. Cl.
*H04N 3/14*    (2006.01)
*H04N 5/335*    (2006.01)
(52) U.S. Cl. ........................................ 348/294; 348/308
(58) Field of Classification Search .................. 348/294, 348/308
See application file for complete search history.

(56) References Cited

U.S. PATENT DOCUMENTS

| | | | | |
|---|---|---|---|---|
| 7,842,986 B2* | 11/2010 | Komoguchi et al. | ......... | 257/291 |
| 2006/0183265 A1* | 8/2006 | Oh et al. | ......... | 438/65 |
| 2007/0145246 A1* | 6/2007 | Roy et al. | ......... | 250/214.1 |
| 2008/0079106 A1* | 4/2008 | Miyagawa et al. | ......... | 257/437 |
| 2008/0135732 A1* | 6/2008 | Toumiya et al. | ......... | 250/208.1 |
| 2009/0130792 A1* | 5/2009 | Lee et al. | ......... | 438/70 |
| 2011/0097838 A1* | 4/2011 | Hashimoto | ......... | 438/69 |
| 2011/0248146 A1* | 10/2011 | Toumiya et al. | ......... | 250/208.1 |

FOREIGN PATENT DOCUMENTS

| | | |
|---|---|---|
| JP | 2003-324189 | 11/2003 |
| JP | 2004-207433 | 7/2004 |
| JP | 2006-190891 | 7/2006 |
| JP | 2006-339339 | 12/2006 |
| JP | 2007-129192 | 5/2007 |

* cited by examiner

*Primary Examiner* — Jordan Schwartz
(74) *Attorney, Agent, or Firm* — SNR Denton US LLP

(57) ABSTRACT

A solid-state image pickup device includes a semiconductor substrate having a light-incident surface, a plurality of pixels arranged on the light-incident surface, a photodiode arranged in each of the pixels, an insulating film arranged on the semiconductor substrate and configured to cover the photodiodes, wirings embedded in the insulating film, an etching stopper film distant from the lowermost wiring among the wirings, arranged adjacent to the semiconductor substrate, configured to cover at least a region where each of the photodiodes is arranged, and composed of silicon carbide, a trench arranged above each of the photodiodes so as to reach the etching stopper film, and an optical waveguide with which each of the trenches is filled, the optical waveguide having a higher refractive index than the insulating film.

8 Claims, 9 Drawing Sheets

SOLID-STATE IMAGE PICKUP DEVICE AND ELECTRONIC APPARATUS

BACKGROUND OF THE INVENTION

1. Field of the Invention

The present invention relates to solid-state image pickup devices and electronic apparatuses. In particular, the present invention relates to a solid-state image pickup device including pixels having photodiodes on a light-incident surface, the pixels being arranged in a matrix, and relates to an electronic apparatus including the solid-state image pickup device.

2. Description of the Related Art

In solid-state image pickup devices such as complementary metal oxide semiconductor (CMOS) sensors and charge-coupled devices (CCDs), light is incident on photodiodes (photoelectric conversion units) arranged on surfaces of semiconductor substrates to generate signal charges in the photodiodes, resulting in image signals.

In CMOS sensors, for example, photodiodes are provided in respective pixels arranged in a two-dimensional matrix on a light-incident surface. Signal charges generated and accumulated in photodiodes in receiving light are transferred to floating diffusion by driving CMOS circuits. Signal charges are converted into signal voltages and read out.

In charge-coupled devices, for example, photodiodes are provided in respective pixels arranged in a two-dimensional matrix on a light-incident surface similar to CMOS sensors. Signal charges generated and accumulated in photodiodes in receiving light are transferred by vertical and horizontal transfer channels and read out.

Solid-state image pickup devices such as CMOS sensors include, for example, photodiodes formed on surfaces of semiconductor substrates. Insulating films composed of, for example, silicon oxide, are formed on photodiodes. Insulating films include wirings formed in regions except photodiode regions so as not to preclude the incidence of light on photodiodes.

In such solid-state image pickup devices as described above, however, the miniaturization of devices results in a reduction in area of light-incident surfaces, disadvantageously reducing the proportion of incident light and sensitivity characteristics.

As measures to overcome the disadvantages, a structure in which concentration of light is performed with on-chip lenses and/or intralayer lenses have been developed. In particular, a solid-state image pickup device including optical waveguides arranged in an insulating film above photodiodes and configured to guide light incident from the outside to a photodiode has been developed.

Solid-state image pickup devices disclosed in Japanese Unexamined Patent Application Publication Nos. 2003-324189 and 2004-207433 each have a structure described below.

The solid-state image pickup device includes a photodiode formed in a pixel arranged in a matrix on a substrate, an insulating film covering the photodiode, a trench in the insulating film above the photodiode, and an optical waveguide in the trench.

In the solid-state image pickup device described above, a copper wiring formed by a damascene process is embedded in the insulating film. The insulating film includes a diffusion preventing film for copper constituting the copper wiring and an etching stopper film used in forming the trench.

In Japanese Unexamined Patent Application Publication Nos. 2003-324189 and 2004-207433, the optical waveguide is formed so as to pass through the diffusion preventing film and the etching stopper film. It is known that in such a structure, dark current and bright defects, which are representative characteristics of solid-state image pickup devices, are unsatisfactory.

Japanese Unexamined Patent Application Publication No. 2006-339339 discloses a solid-state image pickup device including an optical waveguide having the same structure as above.

In the solid-state image pickup device disclosed in Japanese Unexamined Patent Application Publication No. 2006-339339, the optical waveguide is formed so as to reach a silicon nitride film that covers a surface of a substrate.

Japanese Unexamined Patent Application Publication No. 2006-190891 discloses a solid-state image pickup device including an optical waveguide having the same structure as above.

In the solid-state image pickup device disclosed in Japanese Unexamined Patent Application Publication No. 2006-190891, the optical waveguide is formed so as to reach a diffusion preventing film formed in a layer having a wiring formed by a dual damascene process.

In Japanese Unexamined Patent Application Publication Nos. 2006-339339 and 2006-190891, the optical waveguides are formed so as not to pass through the silicon nitride film and the diffusion preventing film that cover the substrate surface, thereby improving the characteristics of dark current and bright defects compared with the solid-state image pickup devices disclosed in Japanese Unexamined Patent Application Publication Nos. 2003-324189 and 2004-207433.

SUMMARY OF THE INVENTION

However, further improvement in characteristics such as dark current and bright defects is necessary, as compared with Japanese Unexamined Patent Application Publication Nos. 2006-339339 and 2006-190891. Furthermore, an increase in sensitivity and a reduction in the amount of color mixing are also necessary.

Solid-state image pickup devices including optical waveguides have a problem of the difficulty in further improving the characteristics such as dark current and bright defects, increasing the sensitivity, and reducing the amount of color mixing.

A solid-state image pickup device according to an embodiment of the present invention includes a semiconductor substrate having a light-incident surface, a plurality of pixels arranged on the light-incident surface, a photodiode arranged in each of the pixels, an insulating film arranged on the semiconductor substrate and configured to cover the photodiodes, wirings embedded in the insulating film, an etching stopper film distant from the lowermost wiring among the wirings, arranged adjacent to the semiconductor substrate, configured to cover at least a region where each of the photodiodes is arranged, and composed of silicon carbide, a trench arranged above each of the photodiodes so as to reach the etching stopper film, and an optical waveguide with which each of the trenches is filled, the optical waveguide having a higher refractive index than the insulating film.

In the solid-state image pickup device according to an embodiment of the present invention, the photodiodes are provided in the respective pixels arranged on the light-incident surface of the semiconductor substrate. The insulating film is arranged on the semiconductor substrate and configured to cover the photodiodes. The wirings are embedded in the insulating film.

The etching stopper film is distant from the lowermost wiring among the wirings, arranged adjacent to the semiconductor substrate, configured to cover at least a region where each of the photodiodes is arranged, and composed of silicon carbide.

The trench is arranged above each of the photodiodes so as to reach the etching stopper film. The optical waveguide with which each of the trenches is filled is provided and has a higher refractive index than the insulating film.

An electronic apparatus according to an embodiment of the present invention includes a solid-state image pickup device, an optical system configured to guide incident light to a light-incident section, and a signal processing circuit configured to process an output signal from the solid-state image pickup device, in which the solid-state image pickup device includes a semiconductor substrate having a light-incident surface, a plurality of pixels arranged on the light-incident surface, a photodiode arranged in each of the pixels, an insulating film arranged on the semiconductor substrate and configured to cover the photodiodes, wirings embedded in the insulating film, an etching stopper film distant from the lowermost wiring among the wirings, arranged on a side of the semiconductor substrate, configured to cover at least a region where each of the photodiodes is arranged, and composed of silicon carbide, a trench arranged above each of the photodiodes so as to reach the etching stopper film, and an optical waveguide with which each of the trenches is filled, the optical waveguide having a higher refractive index than the insulating film.

The electronic apparatus according to an embodiment of the present invention includes the solid-state image pickup device having the plurality of pixels arranged on the light-incident surface, the optical system configured to guide incident light to the light-incident section, and the signal processing circuit configured to process an output signal from the solid-state image pickup device. The solid-state image pickup device has the foregoing structure.

The solid-state image pickup device according to an embodiment of the present invention includes the trench to be formed into the optical waveguide, in which the trench reaches the etching stopper film, i.e., the trench does not pass through the etching stopper film. Furthermore, the etching stopper film is composed of silicon carbide, arranged adjacent to the semiconductor substrate, and distant from the lowermost wiring among the wirings embedded in the insulating film, thereby further improving the characteristics such as dark current and bright defects, increasing the sensitivity, and reducing the amount of color mixing.

The electronic apparatus according to an embodiment of the present invention includes the solid-state image pickup device having the trench to be formed into the optical waveguide, in which the trench reaches the etching stopper film, i.e., the trench does not pass through the etching stopper film. Furthermore, the etching stopper film is composed of silicon carbide, arranged adjacent to the semiconductor substrate, and distant from the lowermost wiring among the wirings embedded in the insulating film, thereby further improving the characteristics such as dark current and bright defects, increasing the sensitivity, and reducing the amount of color mixing.

DESCRIPTION OF THE PREFERRED EMBODIMENTS

A solid-state image pickup device according to an embodiment of the present invention and an electronic apparatus including the solid-state image pickup device will be described below with reference to the attached drawings.

First Embodiment

Figure 1:
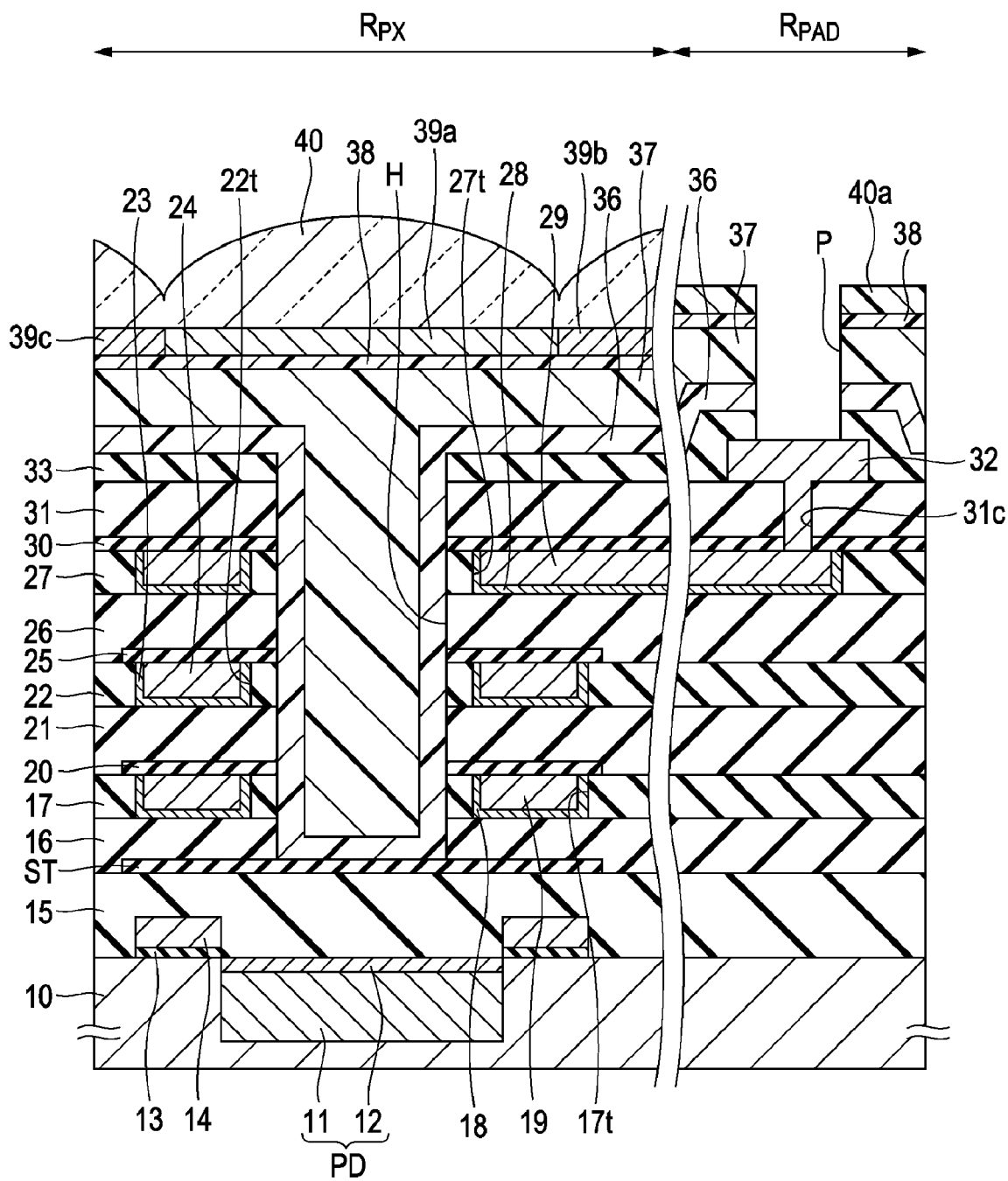
FIG. 1 is a cross-sectional view of a solid-state image pickup device according to a first embodiment of the present invention.

FIG. 1 is a schematic cross-sectional view of a CMOS sensor which is a solid-state image pickup device including a plurality of pixels according to this embodiment, and shows a pixel region $R_{PX}$ and a pad electrode region $R_{PAD}$.

For example, in the pixel region $R_{PX}$ serving as a light-incident surface, an n-type charge accumulation layer 11 and a p$^+$-type surface layer 12 serving as its surface layer are formed in a p-well area of a semiconductor substrate 10 in each of the pixels, thereby forming a photodiode PD having a pn junction. A gate insulating film 13 and a gate electrode 14 are arranged adjacent to the photodiode PD on the semiconductor substrate.

For example, a signal reading section including floating diffusion and a CCD charge transfer channel is arranged on the semiconductor substrate, the signal reading section being configured to read a signal charge or a voltage in response to a signal charge generated and accumulated in the photodiode PD. Thereby, the application of a voltage to the gate electrode 14 transfers a signal charge.

For example, a first insulating film 15 composed of, for example, silicon oxide is arranged on the semiconductor substrate and covers the photodiode PD.

An etching stopper film ST composed of silicon carbide (SiC) is arranged on the first insulating film 15 and covers at least a region where the photodiode PD is arranged.

For example, a second insulating film 16, a third insulating film 17, a fourth insulating film 21, a fifth insulating film 22, a sixth insulating film 26, a seventh insulating film 27, an eighth insulating film 31, a first diffusion preventing film 20, a second diffusion preventing film 25, and a third diffusion preventing film 30 are arranged on the etching stopper film ST.

The second insulating film 16, the third insulating film 17, the fourth insulating film 21, the fifth insulating film 22, the sixth insulating film 26, the seventh insulating film 27, and the eighth insulating film 31 are composed of, for example, silicon oxide.

The diffusion preventing film 20 and the second diffusion preventing film 25 are composed of, for example, silicon carbide.

The third diffusion preventing film 30 is composed of, for example, silicon nitride.

As described above, the first insulating film 15 to the eighth insulating film 31 are stacked to form an insulating layer.

For example, wiring trenches 17t are arranged in the third insulating film 17. The inner walls of the wiring trenches 17t are covered with barrier metal layers 18 composed of tantalum/tantalum nitride. The wiring trenches 17t are filled with first wirings 19 composed of copper.

Similarly, for example, wiring trenches 22t are arranged in the fifth insulating film 22. The inner walls of the wiring trenches 22t are covered with barrier metal layers 23. The wiring trenches 22t are filled with second wirings 24.

Furthermore, for example, wiring trenches 27t are arranged in the seventh insulating film 27. The inner walls of the wiring trenches 27t are covered with barrier metal layers 28. The wiring trenches 27t are filled with third wirings 29.

When the barrier metal layers 18, 23, and 28 are composed of a conductive material as described above, the barrier metal layers 18, 23, and 28 serve as part of the first, second, and third wirings 19, 24, and 29, respectively.

As described above, the first, second, and third wirings 19, 24, and 29, are embedded in the insulating film layer in which the first insulating film 15 to the eighth insulating film 31 are stacked.

In this embodiment, the etching stopper film ST is arranged adjacent to the semiconductor substrate 10 and distant from the first wirings 19, which is the lowermost wiring among the first, second, and third wirings 19, 24, and 29.

The foregoing first, second, and third diffusion preventing films cover the first, second, and third wirings 19, 24, and 29 to prevent the diffusion of copper.

Furthermore, the barrier metal layers 18, 23, and 28 cover side and bottom faces of the first, second, and third wirings 19, 24, and 29 to prevent the diffusion of copper.

As described above, the surfaces of the first, second, and third wirings 19, 24, and 29 are covered with the films configured to prevent the diffusion of copper.

The first, second, and third wirings 19, 24, and 29 and the barrier metal layers 18, 23, and 28 are formed by, for example, a damascene process. Alternatively, an interconnect structure in which they are formed integrally with contact portions in openings communicating from bottom faces of the wiring trenches to the lower wirings by a dual damascene process may be used.

For example, in the pad electrode region $R_{PAD}$, a pad electrode 32 is arranged on the insulating layer. The pad electrode 32 is composed of, for example, aluminum, connected to the third wiring and the like through an opening 31c arranged in the eighth insulating film 31, and has a diameter of about 100 μm.

A ninth insulating film 33 composed of silicon oxide is arranged on the pad electrode 32.

For example, a trench H is arranged in the insulating layer above the photodiode PD so as to pass through the second to ninth insulating films and the first to third diffusion preventing films and reach the etching stopper film ST.

For example, the trench H reaches the middle of the thickness of the etching stopper film ST that constitutes the bottom of the trench H.

For example, the trench H has an opening diameter of about 0.8 μm and an aspect ratio of about 1 to 2 or more, depending on the area of the photodiode, the pixel size, the process rule, and the like.

For example, the inner wall of the trench H is perpendicular to a main surface of the substrate. Alternatively, the trench H may taper toward the bottom thereof.

A passivation film 36 having a refractive index higher than silicon oxide (with a refractive index of 1.45) is arranged above the pad electrode 32 and covers the inner wall of the trench H. The passivation film 36 is composed of, for example, silicon nitride (with a refractive index of 2.0) and has a thickness of about 0.5 μm.

The trench H is filled with a buried layer 37 arranged on the passivation film 36 and having a refractive index higher than silicon oxide. The buried layer 37 has a thickness of about 0.5 μm outside the trench H.

The buried layer 37 is composed of a high-refractive-index resin, e.g., a siloxane resin (with a refractive index of 1.7) or polyimide. A siloxane resin is particularly preferred.

To increase the refractive index, the resin contains fine particles of a metal oxide, e.g., titanium oxide, tantalum oxide, niobium oxide, tungsten oxide, zirconium oxide, zinc oxide, indium oxide, or hafnium oxide.

As described above, the passivation film 36 and the buried layer 37 with a refractive index higher than silicon oxide constitute an optical waveguide.

For example, a planarized resin layer 38 also serving as an adhesive layer is arranged on the buried layer 37. Blue (B), green (G), and red (R) color filters 39a, 39b, and 39c are arranged thereon in each pixels. Microlenses 40 are arranged thereon.

In the pad electrode region $R_{PAD}$, the color filters are not arranged. The ninth insulating film 33, the passivation film 36, the buried layer 37, the planarized resin layer 38, and a resin layer 40a constituting the microlenses are stacked on the pad electrode 32. An opening P is arranged so as to expose the top face of the pad electrode 32.

The CMOS sensor as a solid-state image pickup device according to this embodiment has the structure described above.

In the CMOS sensor according to this embodiment, the trench H to be formed into an optical waveguide is arranged so as to reach etching stopper film ST composed of silicon carbide, i.e., so as not to pass through the etching stopper film ST.

That is, the photodiode is covered with the etching stopper film ST composed of silicon carbide to prevent impurities causing the occurrence of dark current and bright defects from reaching the photodiode. Thereby, it is possible to further improve the characteristics such as dark current and bright defects.

The etching stopper film ST is arranged adjacent to the semiconductor substrate 10 and distant from the first wirings 19 that is the lowermost layer among the first, second, and third wirings 19, 24, and 29 embedded in the insulating layer.

Since the etching stopper film ST is distant from the lowermost first wirings 19, the etching stopper film ST can be located at any position below the lowermost first wirings 19. For example, in the case where a SiO/SiN film is arranged right above a light-receiving portion, the etching stopper film ST can be located near the photodiode SiN so as to be contact with the SiN film.

As described above, the end of the optical waveguide adjacent to the photodiode can be located near the photodiode, so that incident light is guided to a region closer to the photodiode, thereby increasing the sensitivity and reducing the amount of color mixing.

The etching stopper film ST is composed of silicon carbide. The amount of hydrogen generated from silicon carbide during heat treatment is larger than that of silicon nitride. Dark current and bright defects are caused by the generation of electrons from levels due to dangling bonds in the $SiO_2$/Si interface in the sensor portion and Si. Hydrogen generated from silicon carbide is bonded to the dangling bonds to reduce the number of electrons generated, thus preventing the occurrence of dark current and bright defects. Thereby, the etching stopper film composed of silicon carbide further improves the characteristics such as dark current and bright defects compared with a silicon nitride film.

Furthermore, the sensitivity ripple can be inhibited.

In the solid-state image pickup device according to this embodiment, the trench is arranged in the insulating layer above the photodiode and filled with a high-refractive-index material to form the optical waveguide. The passivation film arranged on the pad electrode also serves as a high-refractive-index material embedded in the trench. Thus, even in the case of forming the optical waveguide, the solid-state image pickup device can be produced by a simpler process.

A solid-state image pickup device according to this embodiment may include a logic circuit mounted on the same chip. In this case, the passivation film used to constitute the optical waveguide serves as a passivation film also in the other region where the logic circuit and the like are provided.

A method for producing a solid-state image pickup device according to this embodiment will be described below with reference to the attached drawings.

Figure 2A:
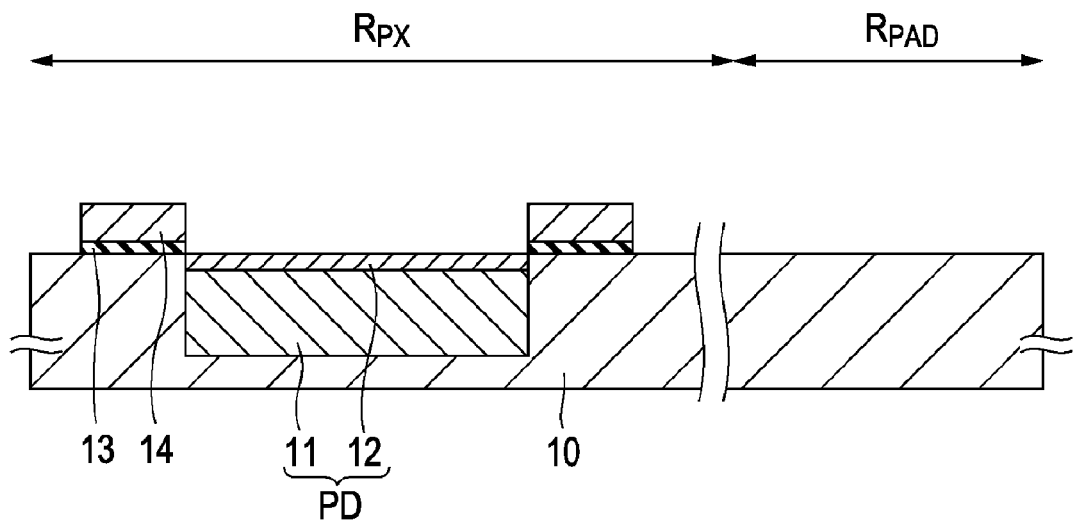
FIGS. 2A and 2B are cross-sectional views illustrating the production process of the solid-state image pickup device according to the first embodiment of the present invention.

As shown in FIG. 2A, for example, in the pixel region $R_{PX}$, the n-type charge accumulation layer 11 and the $p^+$-type surface layer 12 provided thereon are formed in a p-well region of the semiconductor substrate 10 to form the photodiode PD having the pn junction. The gate insulating film 13, the gate electrode 14, a signal reading section including floating diffusion and a CCD charge transfer channel is arranged on the semiconductor substrate, the signal reading section being configured to read a signal charge or a voltage in response to a signal charge generated and accumulated in the photodiode, are arranged adjacent to the photodiode.

Figure 2B:
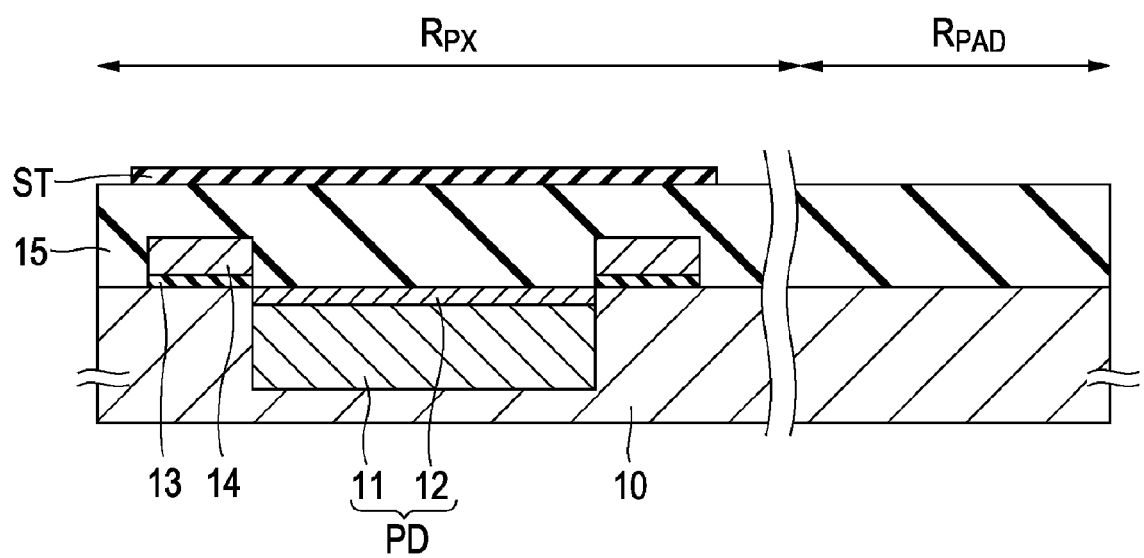

As shown in FIG. 2B, silicon oxide is deposited on the entire surface of the pixel region $R_{PX}$ and the pad electrode region $R_{PAD}$ so as to cover the photodiode PD by, for example, chemical vapor deposition (CVD) to form the first insulating film 15.

For example, silicon carbide is deposited on the first insulating film 15 by CVD. A resist film configured to protect at least a region where the photodiode is arranged is formed by patterning using photolithography and etched by, for example, reactive ion etching (RIE), thereby forming the etching stopper film ST having a pattern to cover at least the region where the photodiode is arranged.

Figure 3A:
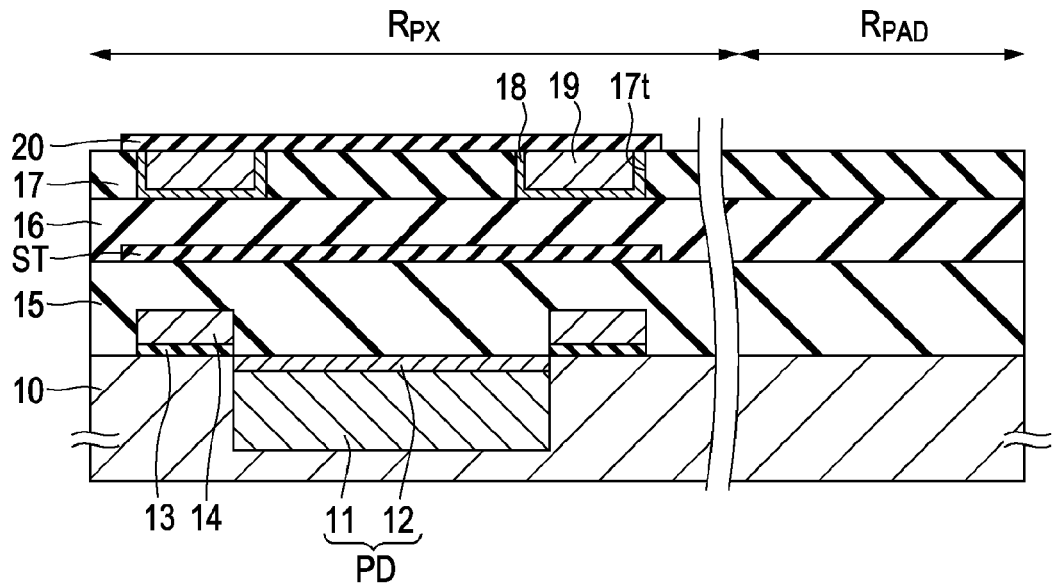
FIGS. 3A and 3B are cross-sectional views illustrating the production process of the solid-state image pickup device according to the first embodiment of the present invention.

As shown in FIG. 3A, for example, silicon oxide is deposited on the etching stopper film ST to form the second insulating film 16. Silicon oxide is further deposited thereon to form the third insulating film 17.

For example, the wiring trenches 17t are formed in the third insulating film 17 by etching. Tantalum and tantalum oxide are deposited so as to cover inner walls of the wiring trenches 17t, forming the barrier metal layers 18, followed by the formation of copper seed layer. Copper is deposited on the entire surface by electrolytic plating. Copper deposited outside the wiring trenches 17t is removed by, for example, chemical-mechanical polishing (CMP) to form the first wirings 19. At this point, the barrier metal layers 18 formed outside the wiring trenches 17t are also removed.

For example, silicon carbide is deposited on the first wirings by CVD and patterned in the same way as the etching stopper film ST, thereby forming the diffusion preventing film 20.

Figure 3B:
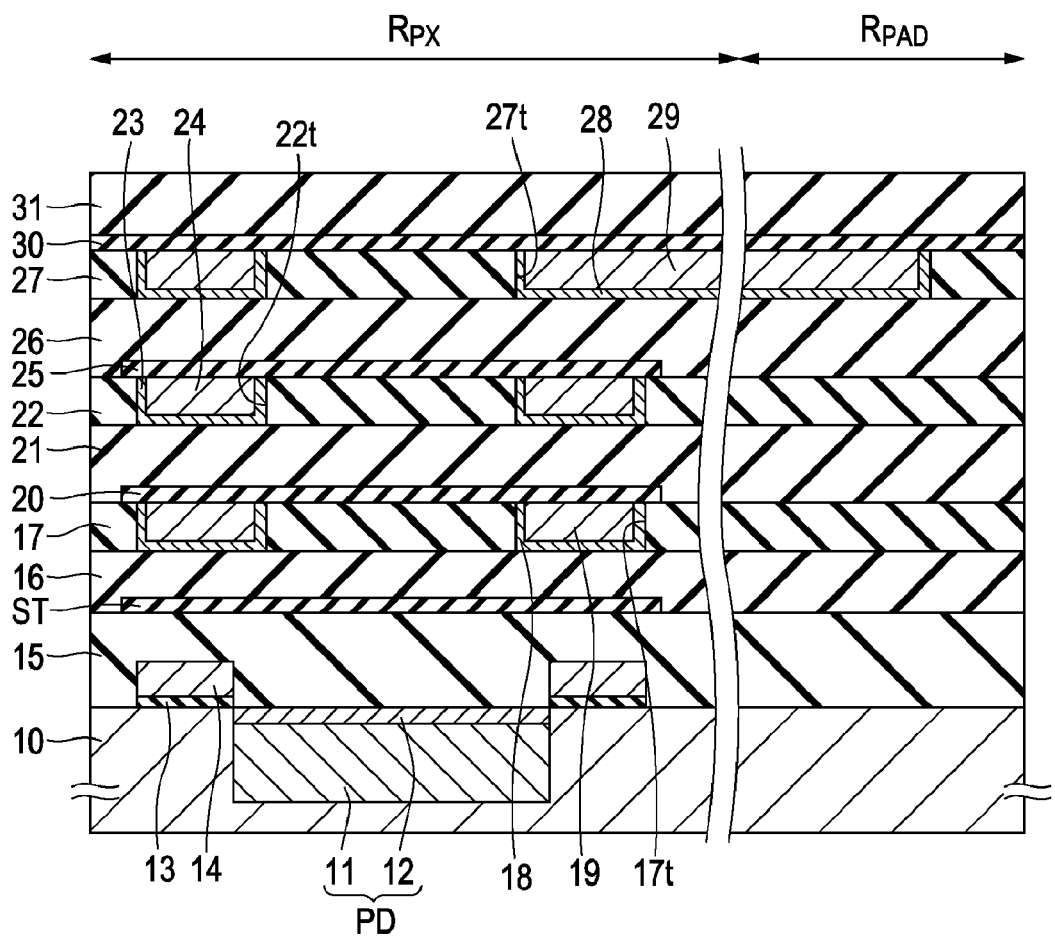

As shown in FIG. 3B, the procedure for forming the second insulating film 16, the third insulating film 17, the wiring trenches 17t, the barrier metal layers 18, the first wirings 19, and the diffusion preventing film 20 is repeated.

For example, the fourth insulating film 21, the fifth insulating film 22, the wiring trenches 22t, the barrier metal layers 23, the second wirings 24, and the second diffusion preventing film 25 are formed. Then the sixth insulating film 26, the seventh insulating film 27, the wiring trenches 27t, the barrier metal layers 28, and the third wirings 29 are formed.

Here, for example, the third wirings are formed so as to extend to the pad electrode region $R_{PAD}$.

Furthermore, silicon nitride is deposited by, for example, CVD to form the third diffusion preventing film 30. The eighth insulating film 31 is formed thereon.

As described above, the first insulating film 15, the second insulating film 16, the third insulating film 17, the fourth insulating film 21, the fifth insulating film 22, the sixth insulating film 26, the seventh insulating film 27, the eighth insulating film 31, the diffusion preventing film 20, the second diffusion preventing film 25, and the third diffusion preventing film 30 are stacked, forming an insulating layer.

The first, second, and third wirings 19, 24, and 29 are embedded in the insulating layer.

With respect to the first, second, and third wirings 19, 24, and 29, for example, an interconnect structure in which they are formed integrally with contact portions in openings communicating from bottom faces of the wiring trenches to the lower wirings by a dual damascene process may be used.

Figure 4A:
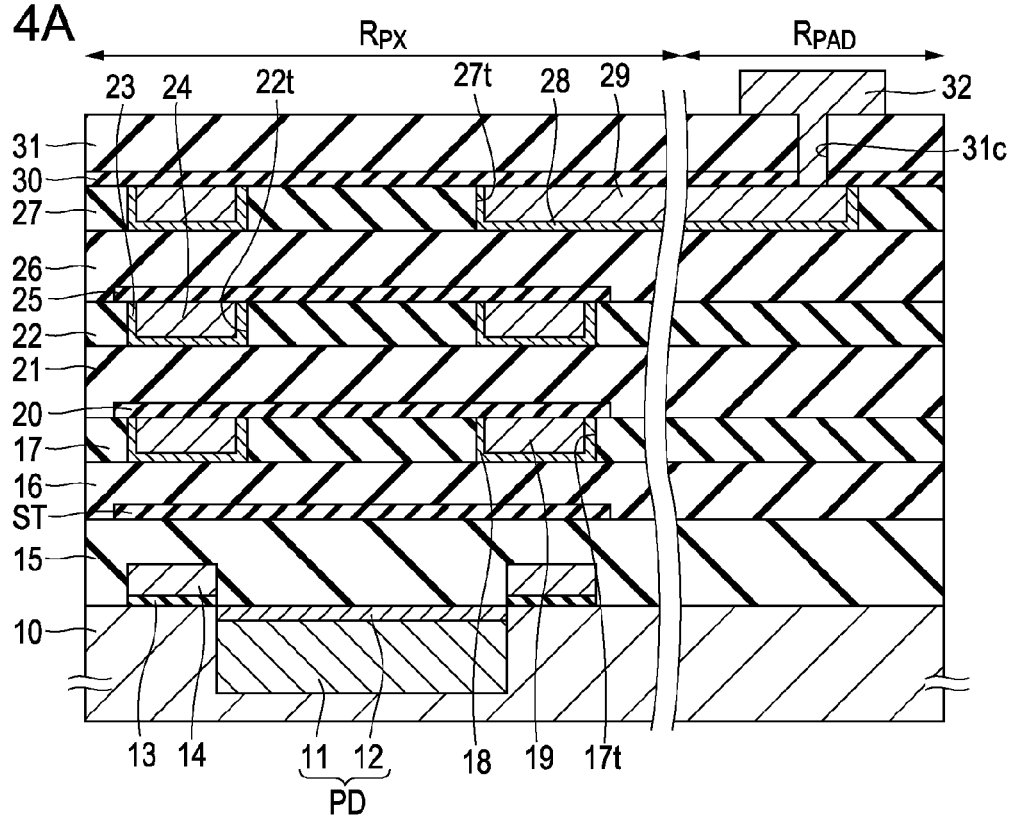
FIGS. 4A and 4B are cross-sectional views illustrating the production process of the solid-state image pickup device according to the first embodiment of the present invention.

As shown in FIG. 4A, the opening 31c communicating with the third wiring is formed in the eighth insulating film 31 and the like. Aluminum is deposited by sputtering at a deposition temperature of, for example, about 300° C. and patterned to form the pad electrode 32 having a diameter of, for example, about 100 μm.

All steps after the formation of the aluminum pad electrode 32 are performed at 400° C. or lower.

Figure 4B:
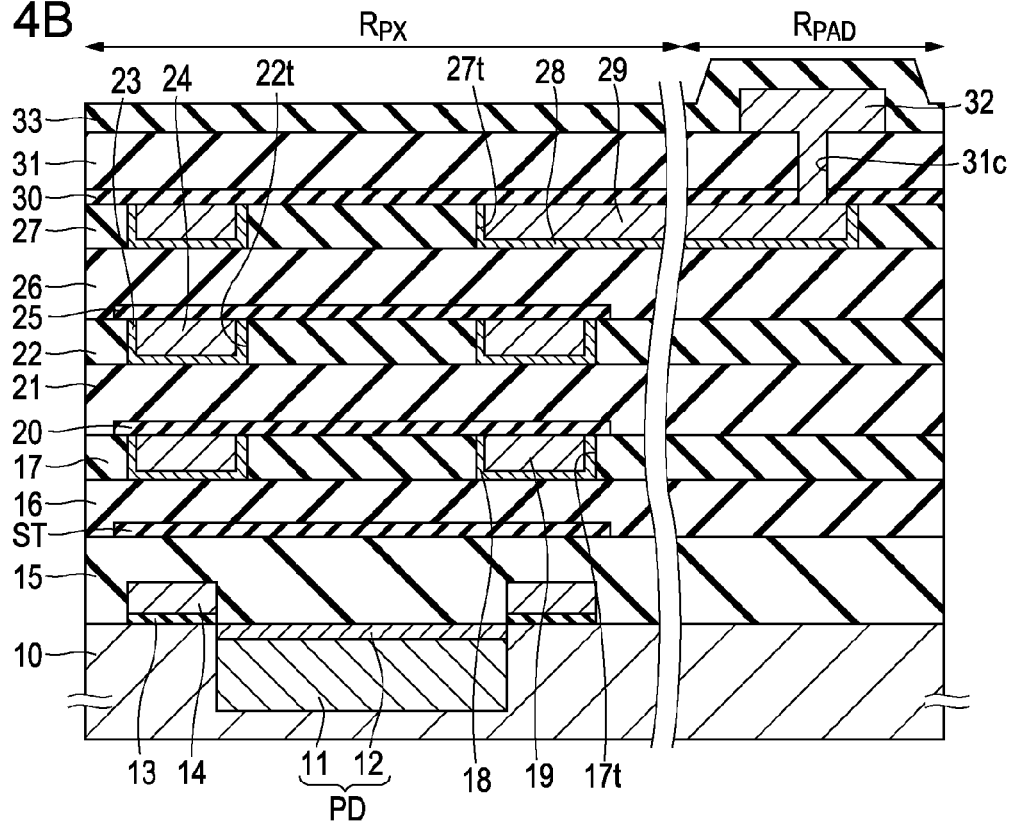

As shown in FIG. 4B, for example, silicon oxide is deposited on the entire surface of the pixel region $R_{PX}$ and the pad electrode region $R_{PAD}$ by CVD so as to cover the pad electrode 32 to form the pad electrode 32.

Figure 5:
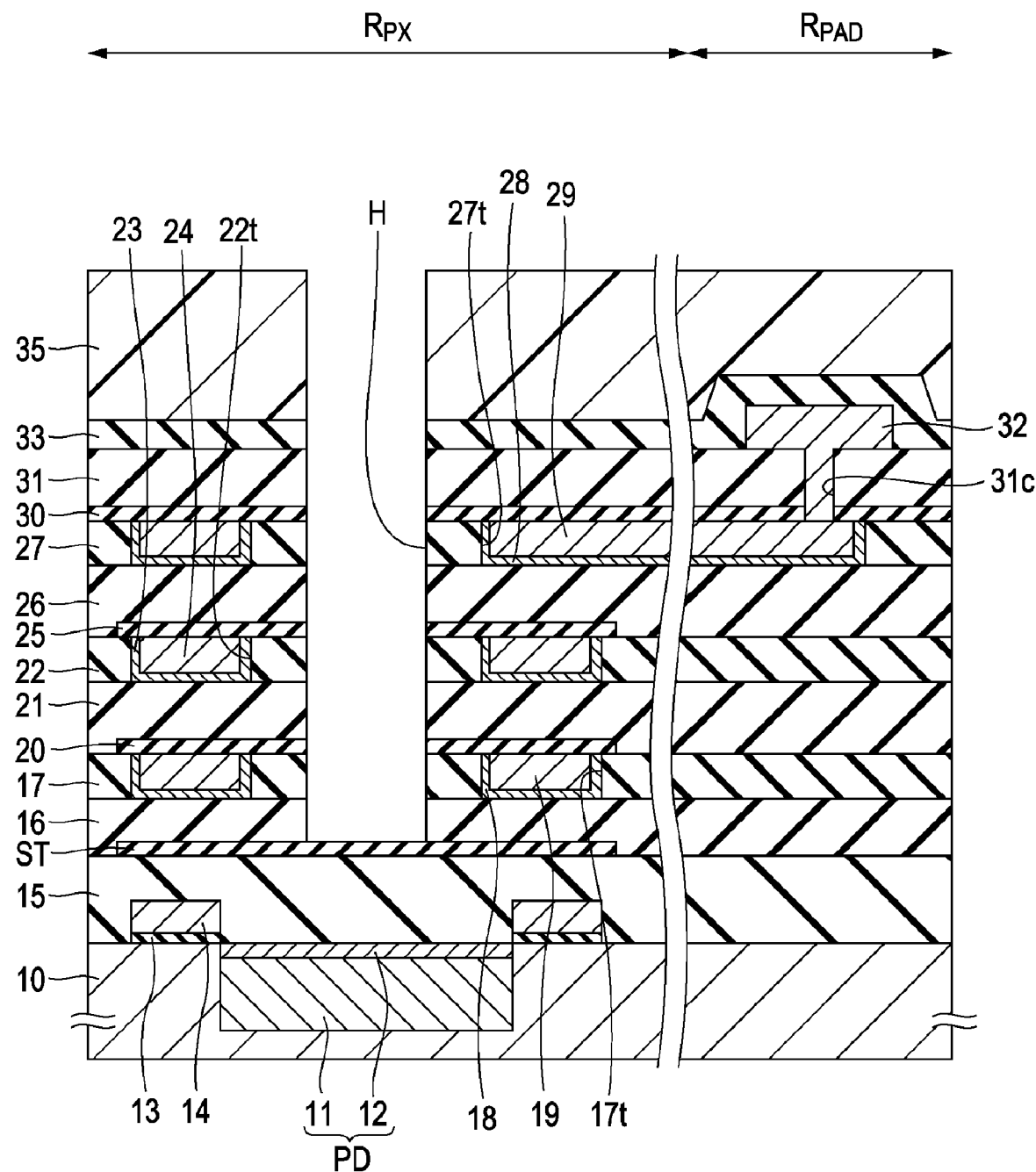
FIG. 5 is a cross-sectional view illustrating the production process of the solid-state image pickup device according to the first embodiment of the present invention.

As shown in FIG. 5, for example, a resist film 35 used to form a trench is formed by photolithography and subjected to anisotropic etching such as RIE to form the trench H passing through the second to ninth insulating films and the first to third diffusion preventing films in such a manner that the trench H reaches the etching stopper film.

In the case of forming the trench H, etching is allowed to proceed while the etching conditions are changed in response to the material such as silicon oxide, silicon nitride, and silicon carbide. The etching is terminated when the bottom of the trench reaches the etching stopper film ST.

For example, the trench H is formed by over-etching so as to reach the middle of the thickness of the etching stopper film ST.

Thereby, the etching stopper film ST constitutes the bottom of the trench H.

In the case where the bottom of the trench H is constituted by the etching stopper film ST, the depth of the trench H is stably determined. This results in a constant distance between the photodiode and the optical waveguide, preventing non-uniformity in characteristics.

Thereby, the trench H having an opening diameter of about 0.8 μm and an aspect ratio of about 1 to 2 or more is formed as above.

Figure 6:
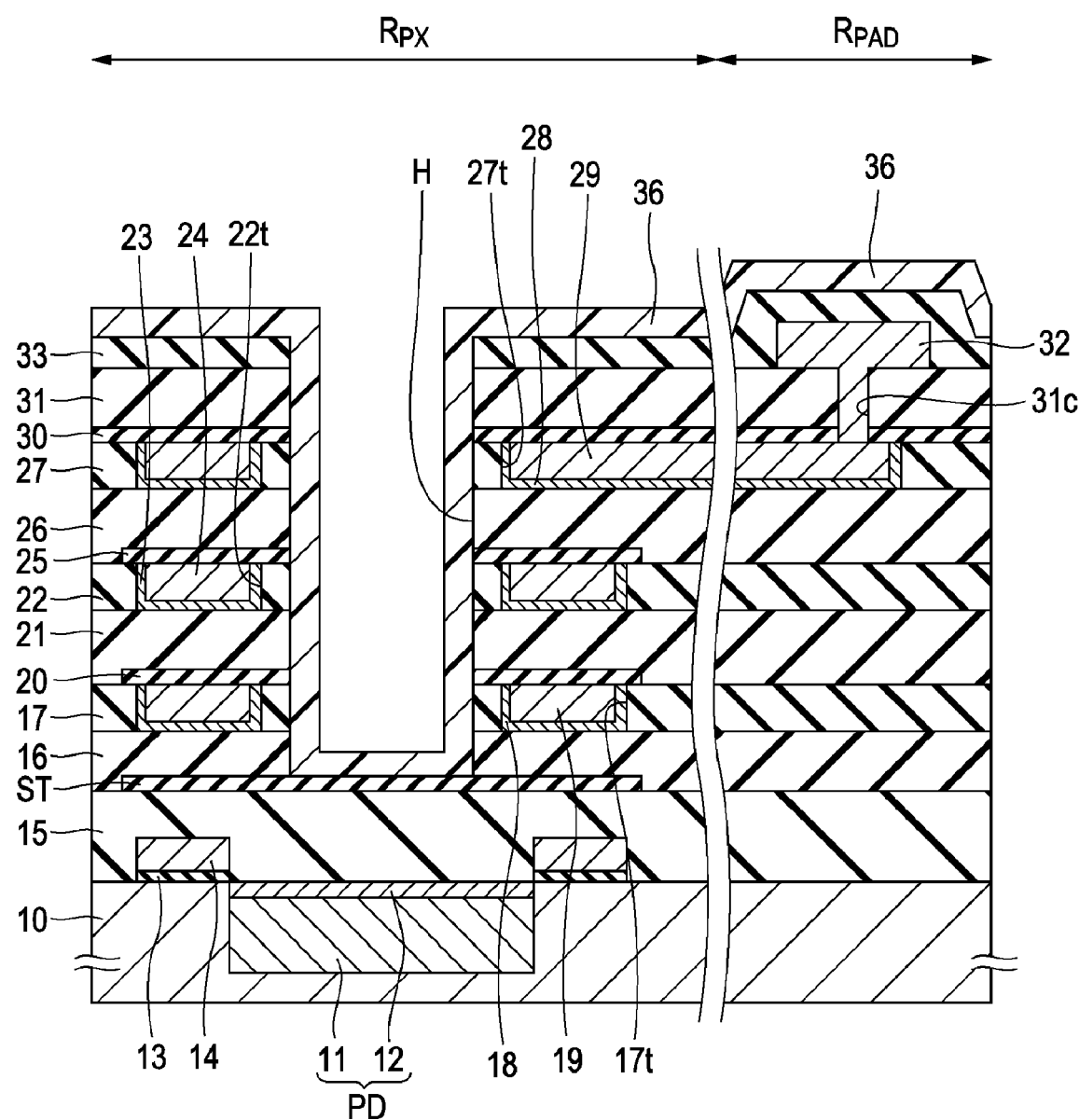
FIG. 6 is a cross-sectional view illustrating the production process of the solid-state image pickup device according to the first embodiment of the present invention.

As shown in FIG. 6, for example, silicon nitride having a refractive index higher than silicon oxide is deposited by plasma-enhanced CVD at a deposition temperature of about 380° C. so as to cover the inner wall of the trench H and be present above the pad electrode 32, thereby forming the passivation film 36 having a thickness of about 0.5 μm.

Figure 7:
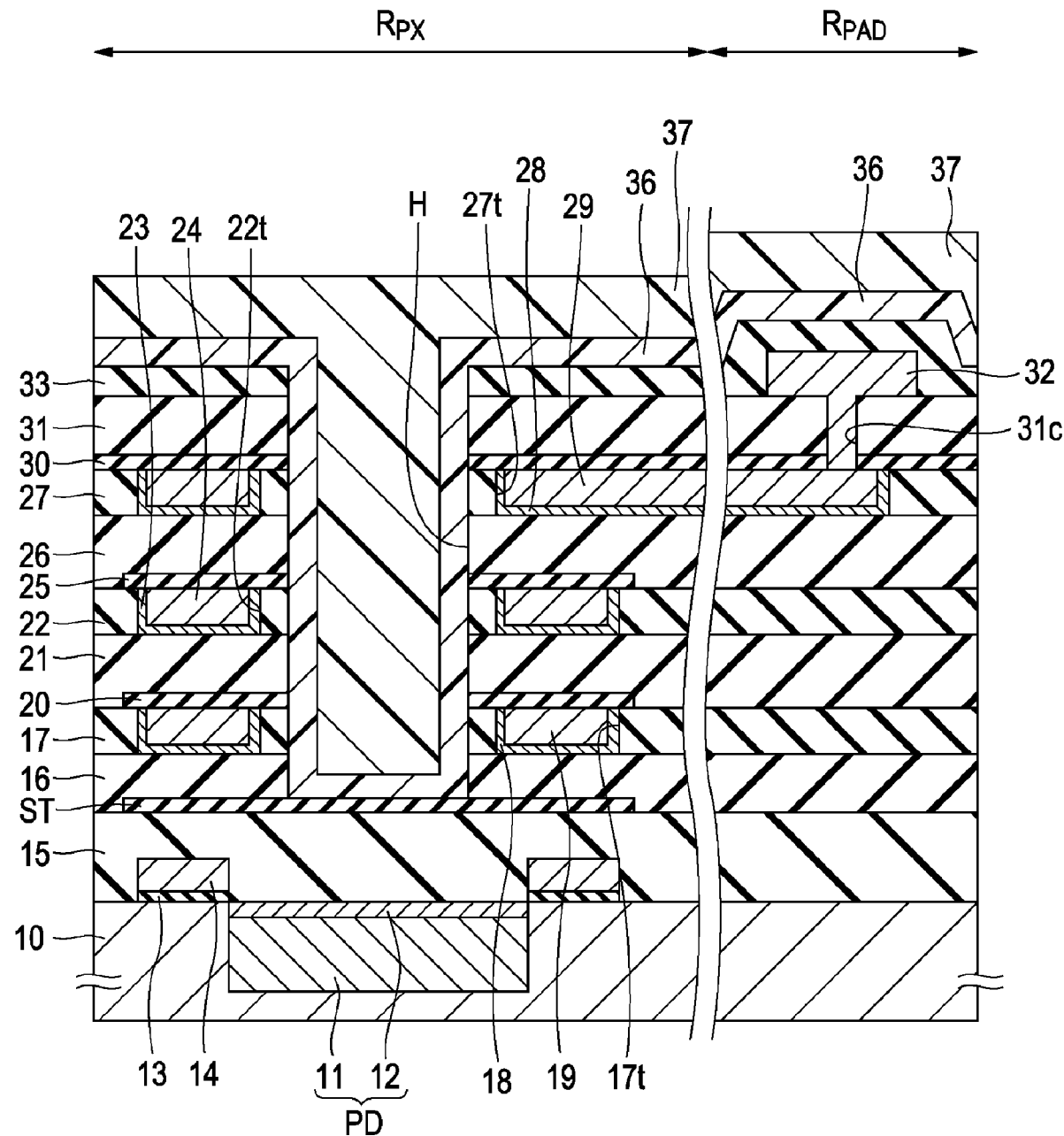
FIG. 7 is a cross-sectional view illustrating the production process of the solid-state image pickup device according to the first embodiment of the present invention.

As shown in FIG. 7, for example, a siloxane resin containing fine particles of a metal oxide such as titanium oxide is applied on the passivation film 36 by spin coating at about 400° C. to form a film having a thickness of about 0.5 μm and the trench H filled with the siloxane resin. Thereby, the buried layer 37 having a refractive index higher than silicon oxide is formed. After the application, post bake treatment is performed at about 300° C., if desired. In the case of using a polyimide resin, for example, a film composed of the polyimide resin can be formed at about 350° C.

For example, the planarized resin layer 38 also serving as an adhesive layer is formed on the buried layer 37. For example, blue (B), green (G), and red (R) color filters 39a, 39b, and 39c are formed thereon in each pixel.

Furthermore, the microlenses 40 are formed thereon.

In the foregoing production method, for example, hydrogen treatment (sintering) for terminating dangling bonds in the semiconductor may be performed after the step of forming the pad electrode and before the step of forming the buried layer composed of the resin.

As shown in FIG. 1, in the pad electrode region $R_{PAD}$, the opening P is formed so as to expose the top face of the pad electrode 32.

Thereby, the CMOS sensor, which is a solid-state image pickup device having the structure shown in FIG. 1 can be produced.

A solid-state image pickup device having further improved characteristics such as dark current and bright defects, an increased sensitivity, and a reduced amount of color mixing can be produced by the method for producing a solid-state image pickup device according to this embodiment.

EXAMPLE 1

According to the first embodiment, a CMOS sensor (a) having the structure in which the etching stopper film ST was located as close as possible to the semiconductor substrate to reduce the distance between the photodiode and the optical waveguide was produced. Here, the passivation film was composed of SiN.

A CMOS sensor (b) was produced as in the CMOS sensor (a), except that the etching stopper film was not formed and that the trench to be formed into an optical waveguide was formed so as to reach the first diffusion preventing film.

Figure 8:
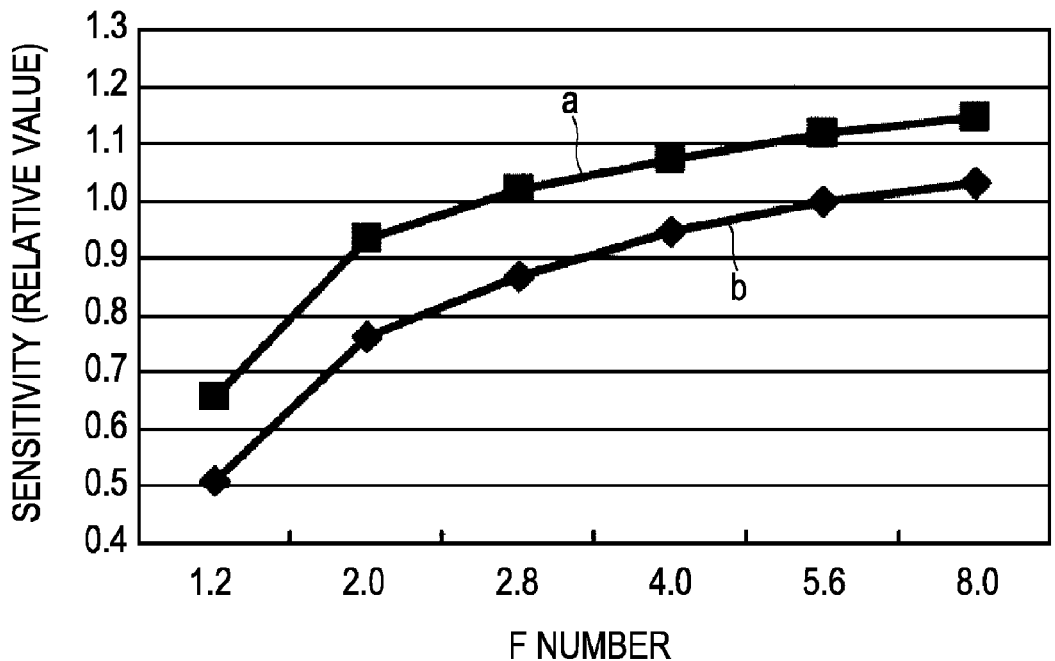
FIG. 8 is a graph showing the sensitivity according to the first embodiment of the present invention.

Sensitivities of the CMOS sensors were measured. FIG. 8 shows the results.

FIG. 8 shows plots of the sensitivities of the CMOS sensors (a) and (b) against the F number.

The sensitivity of the CMOS sensor (a) was 10% to 30% larger than that of the CMOS sensor (b) in the entire range of the F number. The results demonstrated that a reduction in the distance between the photodiode and the optical waveguide by locating the etching stopper film ST near the semiconductor substrate results in improvement in the sensitivity.

EXAMPLE 2

According to the first embodiment, a CMOS sensor (a) having the structure in which the etching stopper film ST was located as close as possible to the semiconductor substrate to reduce the distance between the photodiode and the optical waveguide was produced. Here, the passivation film was composed of SiN.

A CMOS sensor (b) was produced as in the CMOS sensor (a), except that the passivation film was composed of SiON.

A CMOS sensor (c) was produced as in the CMOS sensor (a), except that the etching stopper film was not formed and that the trench to be formed into an optical waveguide was formed so as to reach the first diffusion preventing film.

Figure 9:
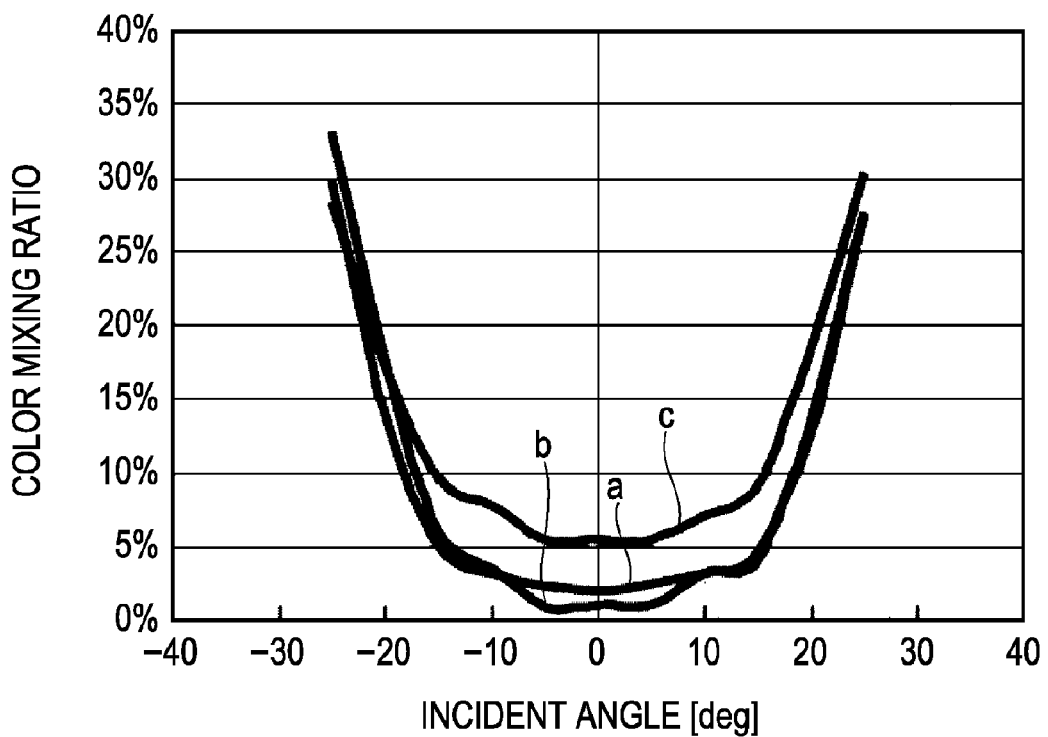
FIG. 9 is a graph showing the color mixing ratio according to a second embodiment of the present invention.

Color mixing ratios of the CMOS sensors were measured. FIG. 9 shows the results.

FIG. 9 shows plots of the color mixing ratios of the CMOS sensors (a), (b), and (c) against the incident angle.

The color mixing ratios of the CMOS sensors (a) and (b) were lower than that of the CMOS sensor (c). The results demonstrated that a reduction in the distance between the photodiode and the optical waveguide by locating the etching stopper film ST near the semiconductor substrate results in a reduction in color mixing ratio.

Second Embodiment

Figure 10:
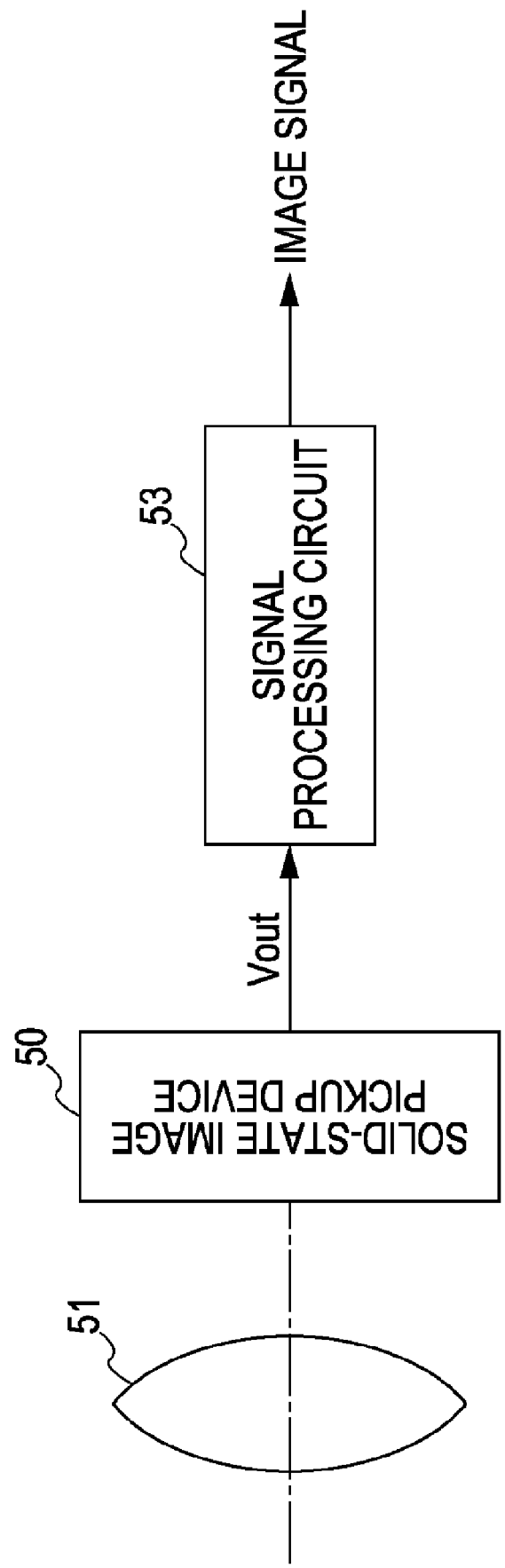
FIG. 10 is a schematic block diagram of an electronic apparatus according to the second embodiment of the present invention.

FIG. 10 is a schematic block diagram of a camera as an electronic apparatus according to this embodiment. The camera according to this embodiment is an example of a video camera capable of capturing a still image or recording a movie.

The camera according to this embodiment includes an image sensor (solid-state image pickup device) 50, an optical system 51, a signal processing circuit 53, and the like.

In this embodiment, the solid-state image pickup device according to the first embodiment is incorporated as the image sensor 50.

The optical system 51 focuses incident light from an object on the image pickup area of the image sensor 50, thereby accumulating signal charges in the image sensor 50 for a certain period of time. The accumulated signal charges are taken out as output signals $V_{out}$.

A shutter controls the light exposure time and the light shielding time for the image sensor 50.

An image processing unit supplies driving a signal that controls the transfer operation of the image sensor 50 and the shutter operation of the shutter. A signal from the image sensor 50 is transferred by the driving signal (timing signal) supplied from the image processing unit. The signal processing circuit 53 subjects the output signal $V_{out}$ from the image sensor 50 to various signal processing operations to feed an image signal. The resulting image signal is stored in a storage medium such as memory or fed into a monitor.

The foregoing electronic apparatus according to this embodiment has further improved characteristics such as dark current and bright defects, an increased sensitivity, and a reduced amount of color mixing.

Furthermore, the sensitivity ripple can be inhibited.

In the embodiment described above, the image sensor 50 including unit pixels configured to detect signal charges in response to the quantity of visible light as physical quantities, the unit pixels being arranged in a matrix, is exemplified. An embodiment of the present invention is not limited to the application to the image sensor 50 but can be applied to a general column-type solid-state image pickup device including column circuits arranged for respective rows of pixels in a pixel array section.

Furthermore, an embodiment of the present invention is not limited to the application to solid-state image pickup devices each configured to detect the distribution of the quantity of incident visible light and capture it as an image but can be applied to general solid-state image pickup devices each configured to capture the distribution of the quantity of incident infrared rays, X rays, or particles as an image. In a broad sense, an embodiment of the present invention can be applied to general solid-state image pickup devices (devices for detecting the distribution of physical quantities), such as fingerprint detecting sensors, each configured to detect the distribution of another physical quantity, e.g., pressure or capacitance, and capture it as an image.

Moreover, an embodiment of the present invention is not limited to the application to solid-state image pickup devices each configured to sequentially scan unit pixels in a pixel array section in a row-by-row fashion and read a pixel signal from each unit pixel but can also be applied to X-Y-address-type solid-state image pickup devices each configured to select any pixel in a pixel-by-pixel fashion and read a signal from the selected pixel in a pixel-by-pixel fashion.

A solid-state image pickup device according to an embodiment of the present invention may be in the form of a chip. Alternatively, the solid-state image pickup device according to an embodiment of the present invention may be in the form of a module having an image pickup function and including a combination of an image pickup unit and a signal processing unit or an optical system.

In addition, an embodiment of the present invention is not limited to the application to solid-state image pickup devices but can be applied to image pickup devices. The term "image pickup devices" is used to indicate electronic devices having image pickup functions, such as camera systems, e.g., digital still cameras and video cameras, and mobile phones. The foregoing module, i.e., a camera module, mounted on an electronic apparatus may be used as an image pickup device.

For image pickup devices such as video cameras, digital still cameras, and camera modules for mobile devices such as mobile phones, the use of the image sensor 50 as a solid-state image pickup device according to the embodiment described above results in a high-quality image in a simple structure.

The present invention is not limited to the foregoing description.

For example, an embodiment of the present invention can be applied to CMOS sensors and CCD elements.

The first insulating film 15 can be omitted. That is, the structure in which the first insulating film 15 is arranged between the etching stopper film ST and the semiconductor substrate 10 may be used as in the embodiments described above. Alternatively, a structure in which the etching stopper film ST is arranged on the semiconductor substrate 10 may be used.

Various changes may be made without departing from the scope of the invention.

The present application contains subject matter related to that disclosed in Japanese Priority Patent Application JP 2008-123942 filed in the Japan Patent Office on May 9, 2008, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state image pickup device comprising:
a semiconductor substrate having a light-incident surface;
a plurality of pixels arranged on the light-incident surface;
a photodiode arranged in each of the pixels;
an insulating film arranged on the semiconductor substrate and configured to cover the photodiodes;
wirings containing copper embedded in the insulating film, each of the wirings being covered with a coating configured to prevent diffusion of the copper, each of the coatings including (a) a barrier metal layer configured to cover a lower surface and side surfaces of each of the wirings and (b) a diffusion preventing film configured to cover an upper surface of each of the wirings;
a film which makes etching stop, said film which makes etching stop being distant from a lowermost wiring among the wirings;
a trench arranged above each of the photodiodes so as to reach the film which makes etching stop, said trench disposed so as not to pass entirely through the film which makes etching stop; and
a structure with which each of the trenches is filled, the structure having a higher refractive index than the insulating film.

2. The solid-state image pickup device according to claim 1, further comprising a silicon oxide film arranged between the semiconductor substrate and the film which makes etching stop.

3. The solid-state image pickup device according to claim 1, wherein each of the structures includes a passivation film configured to cover the inner wall of each of the trenches, and a buried layer arranged on each of the passivation films and configured to be buried in the corresponding trench.

4. An electronic apparatus comprising:
a solid-state image pickup device;
an optical system configured to guide incident light to a light-incident section; and
a signal processing circuit configured to process an output signal from the solid-state image pickup device, wherein the solid-state image pickup device includes a semiconductor substrate having a light-incident surface;
a plurality of pixels arranged on the light-incident surface;
a photodiode arranged in each of the pixels;
an insulating film arranged on the semiconductor substrate and configured to cover the photodiodes;
wirings containing copper embedded in the insulating film, each of the wirings being covered with a coating configured to prevent diffusion of the copper, each of the coatings including (a) a barrier metal layer configured to cover a lower surface and side surfaces of each of the wirings and (b) a diffusion preventing film configured to cover an upper surface of each of the wirings;
a film which makes etching stop, said film which makes etching stop being distant from a lowermost wiring among the wirings;
a trench arranged above each of the photodiodes so as to reach the film which makes etching stop, said trench disposed so as not to pass entirely through the film which makes etching stop; and
a structure with which each of the trenches is filled, the structure having a higher refractive index than the insulating film.

5. The solid-state image pickup device according to claim 1, wherein the film which makes etching stop is composed of silicon carbide.

6. The solid-state image pickup device according to claim 1, wherein the structure comprises an optical waveguide.

7. The electronic apparatus according to claim 4, wherein the film which makes etching stop is composed of silicon carbide.

8. The electronic apparatus according to claim 4, wherein the structure comprises an optical waveguide.

* * * * *